(12) United States Patent
Chu et al.

(10) Patent No.: US 12,438,003 B2
(45) Date of Patent: Oct. 7, 2025

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Li-Wei Chu, New Taipei (TW);
Yu-Hsiang Liao, Hsinchu (TW);
Hung-Hsu Chen, Tainan (TW);
Chih-Wei Chang, Hsin-Chu (TW);
Ming-Hsing Tsai, Chu-Pei (TW);
Ying-Chi Su, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 658 days.

(21) Appl. No.: 17/842,765

(22) Filed: Jun. 16, 2022

(65) Prior Publication Data
US 2023/0411160 A1  Dec. 21, 2023

(51) Int. Cl.
*H01L 21/28* (2025.01)
*H01L 21/285* (2006.01)
*H10D 62/10* (2025.01)
*H10D 64/64* (2025.01)

(52) U.S. Cl.
CPC .. *H01L 21/28537* (2013.01); *H01L 21/28518* (2013.01); *H10D 62/106* (2025.01); *H10D 64/64* (2025.01); *H10D 64/647* (2025.01)

(58) Field of Classification Search
CPC ........ H01L 21/28518; H01L 21/28537; H10D 62/106; H10D 64/64; H10D 64/647; H10D 30/01; H10D 30/00; H10D 30/024; H10D 30/025; H10D 30/027; H10D 30/0281; H10D 30/0291; H10D 30/021; H10D 30/60
USPC ......................................... 438/570
See application file for complete search history.

(56) References Cited

U.S. PATENT DOCUMENTS 11,482,458 B2 * 10/2022 Chu ................... H10D 84/0193

* cited by examiner

*Primary Examiner* — Monica D Harrison
(74) *Attorney, Agent, or Firm* — WPAT LAW; Anthony King

(57) ABSTRACT

A semiconductor structure and a method for forming a semiconductor structure are provided. The semiconductor structure includes an epitaxial structure and a metal silicide layer. The epitaxial structure includes a semiconductor material. The metal silicide layer is disposed on the epitaxial structure. The metal silicide layer includes the semiconductor material, a first metal material and a second metal material. An atomic size of the first metal material is greater than an atomic size of the second metal material, and a concentration of the first metal material in the metal silicide layer varies along a thickness direction.

20 Claims, 14 Drawing Sheets

SEMICONDUCTOR STRUCTURE AND MANUFACTURING METHOD THEREOF

BACKGROUND

The semiconductor integrated circuit (IC) industry has experienced exponential growth over the last few decades. As a result of IC evolution, functional density (i.e., a number of interconnected devices per chip area) has generally increased while geometry size (i.e., a smallest component (or line) that may be created using a fabrication process) has decreased. Continuing reduction in device size and increasingly complicated circuit designs have made designing and fabrication of integrated circuit devices more challenging and costly. In the fabrication of integrated circuit devices, logic products are often produced using silicide operations in order to obtain higher circuit performance. However, issues, such as metal extrusion, emerge during the silicide operations as the devices are shrunk even further.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
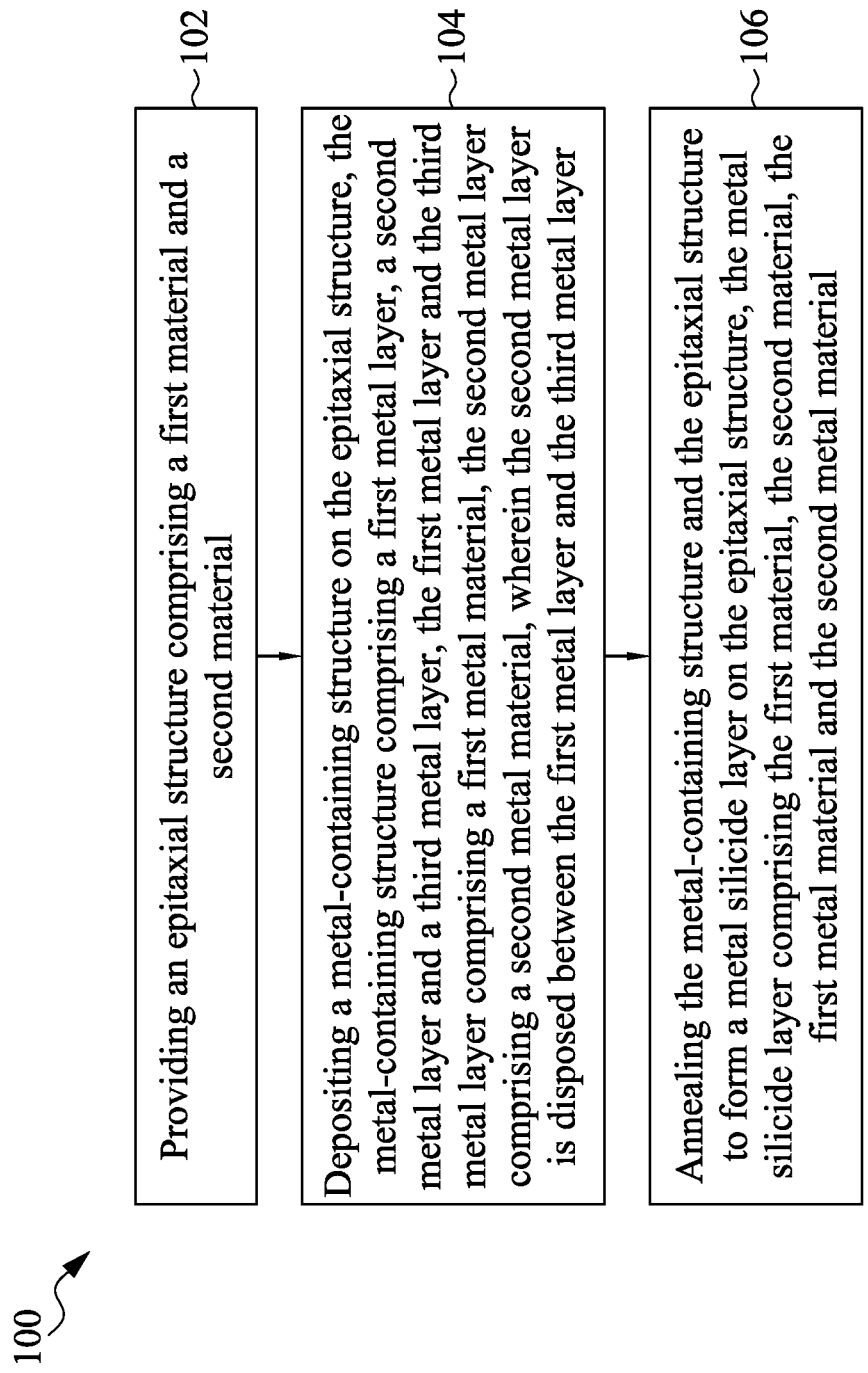
FIG. 1 is a flowchart representing a method for manufacturing a semiconductor structure according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. It should be appreciated that the following figures are not drawn to scale; rather, these figures are merely intended for illustration.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A prevalent way of reducing contact resistance between interconnect lines and gate electrodes or between interconnect lines and source/drain regions is by forming a metal silicide atop the gate electrode and the source/drain regions prior to the formation of various conductive interconnect lines. A silicided region where the metal silicide is formed has lower resistance than a non-silicided region, and hence, higher circuit performance is expected. However, as device sizes are reduced, issues related to the metal silicide emerge. For example, metal extrusion (or metal spiking), where the metal diffuses unevenly into a silicon wafer or a silicon layer, may be induced. Presently, in some embodiments, a metal layer, such as nickel (Ni), is blanketly deposited over a silicon wafer, specifically over exposed source/drain regions or exposed gate electrode regions. Next, the silicon wafer may be subjected to an annealing operation. This annealing operation causes the metal to selectively react with exposed silicon of the source/drain regions and the gate electrodes, thereby forming a metal silicide (e.g., NiSi). However, after the formation of the metal silicide, the silicon wafer may be subjected to one or more thermal operations, for example at a temperature of about 400° C. or higher, which may transform the metal silicide into an uncontrollable phase (e.g., disilicide phase, $NiSi_2$). The formation of the uncontrollable phase of the metal silicide may cause a leakage current and low reliability, particularly when forming shallow junctions, due to the metal extrusion issue. In some embodiments, such extrusion issue is made worse when the metal silicide is formed on an epitaxial structure, which may have defects such as vacancies, clustering and voids, leading to device failure. Accordingly, an alternative approach to forming the metal silicide is of primary importance.

Some embodiments of the present disclosure provide a semiconductor structure and a method for manufacturing the semiconductor structure that provides one or more improvements over existing approaches. The present disclosure provides a metal-containing structure or a multi-layered structure prior to formation of a metal silicide layer. In some embodiments, the metal-containing structure or the multi-layered structure includes large-sized metal material that is deposited or implanted prior to performance of an anneal operation. Such large-sized metal material may obstruct diffusing paths and thus suppress metal diffusion or extrusion. Accordingly, the metal extrusion may be mitigated.

FIG. 1 is a flowchart representing a method 100 for manufacturing a semiconductor structure according to aspects of one or more embodiments of the present disclosure. The method 100 includes an operation 102, in which an epitaxial structure is provided. In some embodiments, the epitaxial structure includes a first material and a second material. The method 100 includes an operation 104, in which a metal-containing structure is deposited on the epitaxial structure. In some embodiments, the metal-containing structure includes a first metal layer, a second metal layer and a third metal layer. The first metal layer and the third metal layer may include a first metal material, and the second metal layer may include a second metal material. In some embodiments, the second metal layer is disposed between the first metal layer and the third metal layer. The method 100 includes an operation 106, in which the metal-containing structure and the epitaxial structure are annealed to form a metal silicide layer on the epitaxial structure. In some embodiments, the metal silicide layer includes the first material, the second material, the first metal material and the second metal material. In some embodiments, a concentration of the first metal material in the metal silicide layer varies along a thickness direction. The method 100 for manufacturing the semiconductor structure will be further described according to one or more embodiments. It should be noted that the operations of the method 100 for manufacturing the semiconductor structure may be rearranged or otherwise modified within the scope of the various aspects. It should further be noted that additional processes may be provided before, during, and after the method 100, and that some other processes may only be briefly described herein. Thus, other implementations are possible within the scope of the various aspects described herein.

Figure 2:
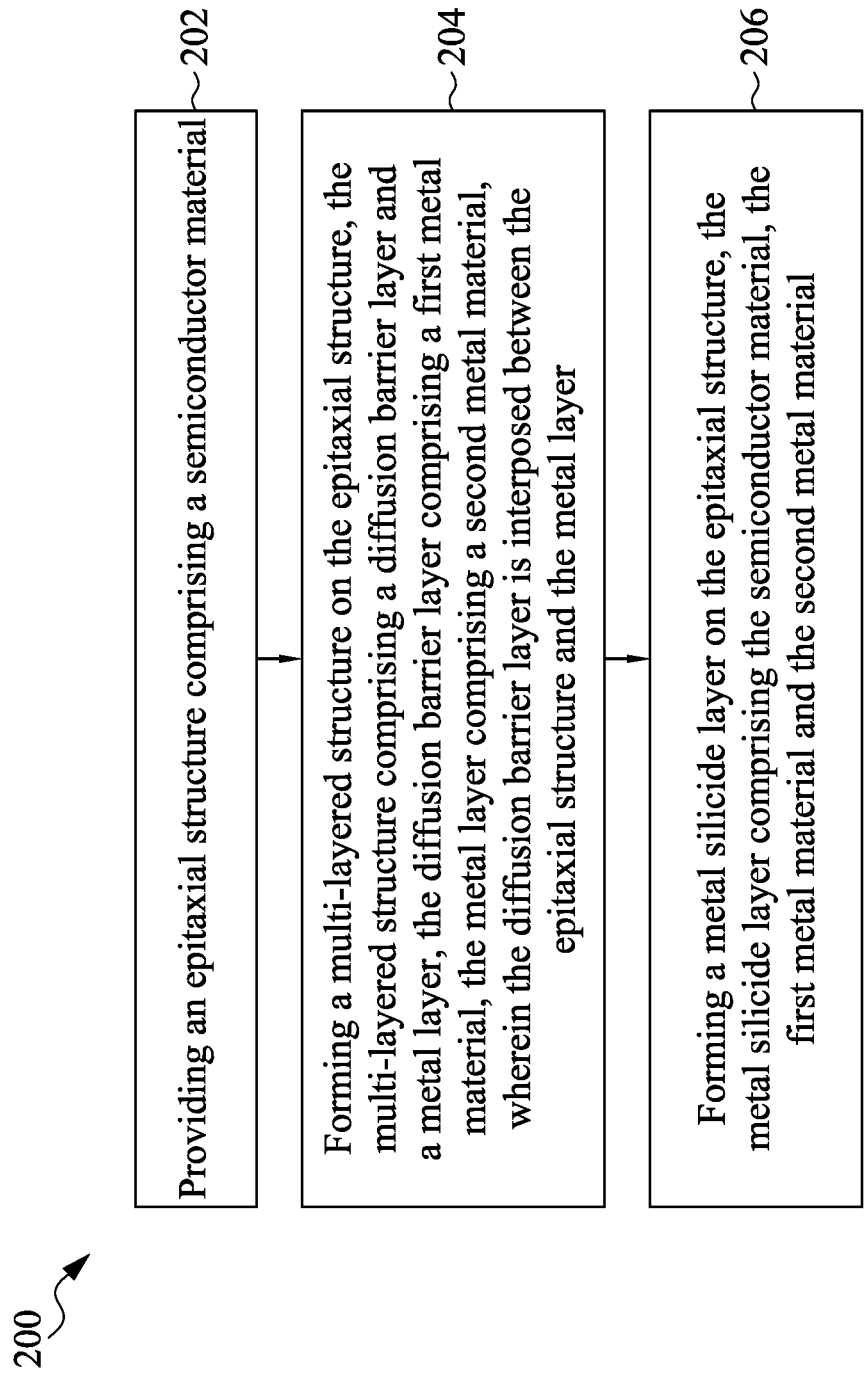
FIG. 2 is a flowchart representing a method for manufacturing a semiconductor structure according to aspects of one or more embodiments of the present disclosure.

FIG. 2 is a flowchart representing a method 200 for manufacturing a semiconductor structure according to aspects of one or more embodiments of the present disclosure. The method 200 includes an operation 202, in which an epitaxial structure is provided. In some embodiments, the epitaxial structure includes a semiconductor material. The method 200 includes an operation 204, in which a multi-layered structure is formed on the epitaxial structure. In some embodiments, the multi-layered structure includes a diffusion barrier layer and a metal layer. The diffusion barrier layer may include a first metal material, and the metal layer may include a second metal material. In some embodiments, the diffusion barrier layer is interposed between the epitaxial structure and the metal layer. The method 200 includes an operation 206, in which a metal silicide layer is formed on the epitaxial structure. In some embodiments, the metal silicide layer includes the semiconductor material, the first metal material and the second metal material. In some embodiments, a concentration of the second metal material in the metal silicide layer varies along a thickness direction. The method 200 for manufacturing the semiconductor structure will be further described according to one or more embodiments. It should be noted that the operations of the method 200 for manufacturing the semiconductor structure may be rearranged or otherwise modified within the scope of the various aspects. It should further be noted that additional processes may be provided before, during, and after the method 200, and that some other processes may only be briefly described herein. Thus, other implementations are possible within the scope of the various aspects described herein.

Figure 3:
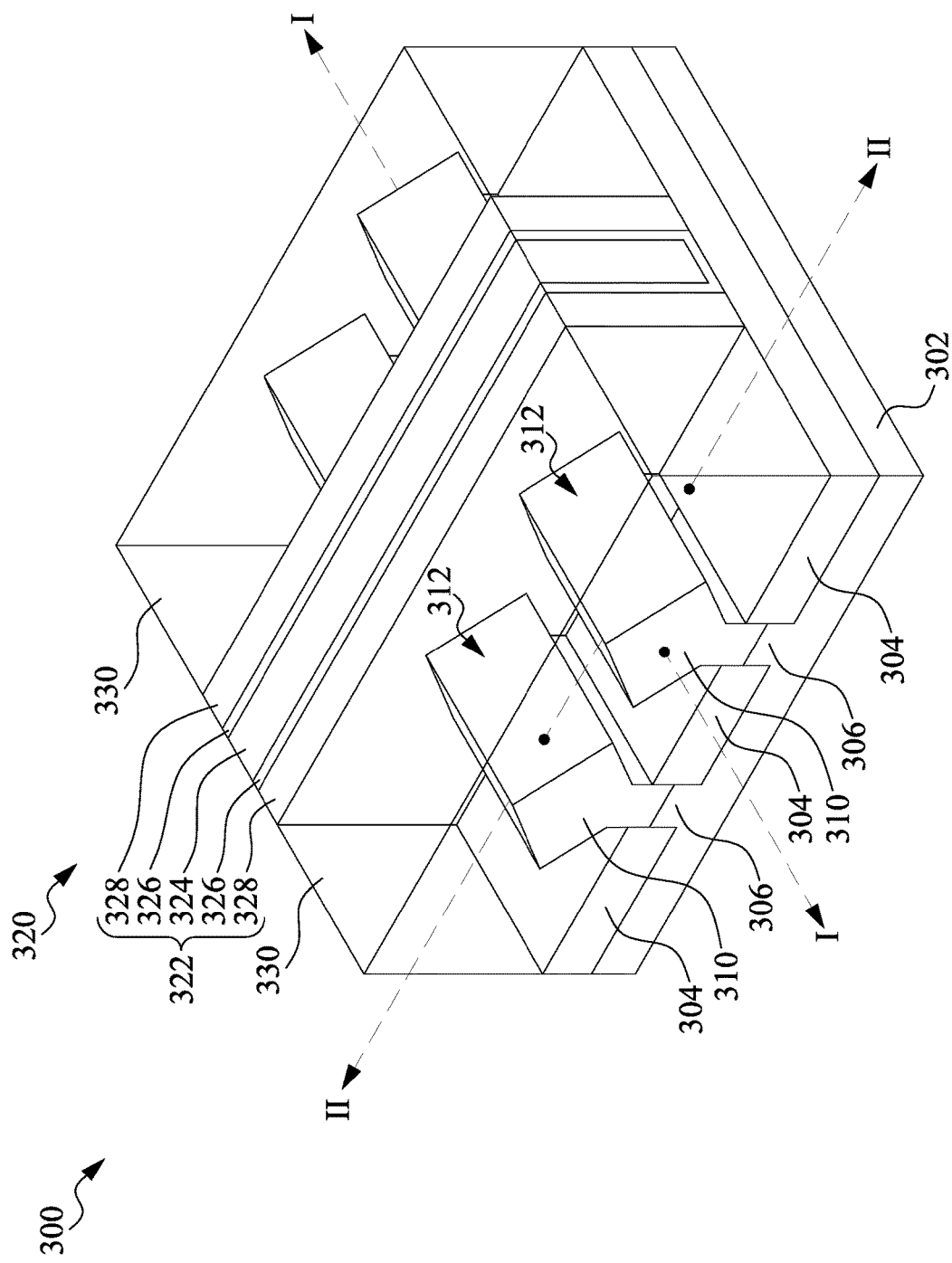
FIG. 3 is a schematic drawing illustrating a semiconductor structure at a fabrication stage constructed according to aspects of the present disclosure in one or more embodiments.

FIG. 3 is a schematic drawing illustrating a semiconductor structure 300 at a fabrication stage constructed according to aspects of the present disclosure in one or more embodiments. The semiconductor structure 300 may include one or more transistor devices, for example, fin field-effect transistor (FinFET) devices. Some features of the transistor device are omitted for illustration clarity. The illustrated transistor device may be electrically connected or coupled in a manner to operate as, for example, one transistor device or as multiple transistor devices, such as two transistor devices.

The semiconductor structure 300 includes a substrate 302. The substrate 302 may be a semiconductor wafer such as a silicon wafer. Alternatively or additionally, the substrate 302 may include elementary semiconductor materials, compound semiconductor materials, or alloy semiconductor materials. The substrate 302 may have a multi-layered structure (e.g., as shown in FIG. 8B). The substrate 302 may include various doping configurations depending on design requirements as is known in the art. For example, different doping profiles (e.g., n wells and p wells) may be formed on the substrate 302 in regions designed for different device types (e.g., n-type field effect transistors (NFET) and p-type field effect transistors (PFET)). The suitable doping may include ion implantation of dopants and/or diffusion processes. The substrate 302 may have isolation structures (e.g., shallow trench isolation (STI) structures) 304 interposing the regions containing different device types. In some embodiments, the substrate 302 may include fin structures 306 electrically isolated from each other by the isolation structures 304. The fin structures 306 may protrude above and between neighboring isolation structures 304. Although the isolation structures 304 are illustrated in FIG. 3 as having a single-layered structure, the isolation structures 304 may have a multi-layered structure (as shown in FIG. 8B). Additionally, although the fin structures 306 are illustrated as comprising a single, continuous material of the substrate 302, the fin structures 306 and/or the substrate 302 may include a single material or a plurality of materials. In this context, the fin structures 306 refer to the portions extending between the neighboring isolation structures 304.

Still referring to FIG. 3, one or more epitaxial structures 310 are provided. The respective step is shown as the operation 102 of the method 100 in FIG. 1 or the operation 202 of the method 200 in FIG. 2. In some embodiments, the one or more epitaxial structures 310 may be formed in the substrate 302. In some embodiments, a transistor device 320, which may be, for example, a PFET or an NFET device, is formed over the substrate 302. The transistor device 320 includes a gate structure 322 including a gate electrode 324 and a gate dielectric layer 326. The gate structure 322 is disposed along sidewalls and over top surfaces of the fin structures 306. In some embodiments, the gate electrode 324 may be a polysilicon gate, a polysilicon sacrificial gate, or a metal gate electrode, but the disclosure is not limited thereto. Spacers 328 are disposed on sidewalls of the gate structure 322. Although the spacers 328 are illustrated as having a single-layered structure, the spacers 328 may have a multi-layered structure. Source/drain regions 312 are formed within the substrate 302 and on opposing sides of the gate structure 322 and the spacers 328. The spacers 328 separate the source/drain regions 312 from the gate structure 322. The term "source/drain region(s)" may refer to a source or a drain, individually or collectively dependent upon context. In some embodiments, each of the source/drain regions 312 includes the epitaxial structure 310 serving as a source/drain stressor.

The epitaxial structure 310 includes a first material and a second material different from the first material. In some embodiments, a lattice constant of the first material is different from that of the second material. In some embodiments, the first material and the second material are semiconductor materials. In some embodiments, in which the transistor device 320 is a PFET device, the first material includes silicon (Si) and the second material includes germanium (Ge), but the disclosure is not limited thereto. In some embodiments, in which the transistor device 320 is an NFET device, the first material includes silicon (Si) and the second material includes phosphorous (P), but the disclosure is not limited thereto. In some embodiments, the formation of the epitaxial structure 310 may be achieved by etching the substrate 302 to form recesses therein, and then performing an epitaxy to grow the epitaxial structure 310 in the recesses. In some embodiments, the epitaxial structure 310 may include a multi-layered structure, wherein each layer of the multi-layered structure includes a different concentration of the second material (e.g., Ge concentration or P concentration) that is gradually increased from a bottom of the recess. Further, depending on a specification requirement of the transistor device 320, a suitable range of the concentration of the second material may be determined to yield an optimum level of performance. In embodiments where multiple transistor devices 320 are formed, the epitaxial structure 310 may be shared between various transistor devices. In embodiments where one transistor device 320 is formed over multiple fin structures 306, neighboring epitaxial structures 310 may be electrically connected, such as through merging the epitaxial structures 310 by epitaxial growth, or through coupling the epitaxial structures 310 with a same source/drain contact.

In some embodiments, a dielectric structure 330 is disposed over the epitaxial structures 310 and the isolation structures 304. In some embodiments, the dielectric structure 330 includes an etch-stop layer (e.g., a contact etch-stop layer (CESL)) (not shown) and various dielectric layers (e.g., an inter-layer dielectric (ILD) layer) formed over the substrate 302 after the forming of the epitaxial structures 310. In some embodiments, the CESL includes a SiN layer, a SiCN layer, a SiON layer, and/or other materials known in the art. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the CESL and the ILD layer are deposited, a planarization process, such as a chemical mechanical planarization (CMP) operation, may be performed to form the dielectric structure 330.

FIG. 3 further illustrates several reference cross-sections. Cross-section I-I extends along a longitudinal axis of a fin structure 306 and in a direction of, for example, a current flow between the source/drain regions 312 of the transistor device 320. Cross-section II-II is perpendicular to cross-section I-I and extends through the source/drain regions 312 of the transistor device 320. Subsequent figures refer to these reference cross-sections for clarity.

FIGS. 4 to 7, 8A to 8B and 9 are schematic drawings illustrating the semiconductor structure 300 at various fabrication stages constructed according to aspects of the present disclosure in one or more embodiments. FIGS. 4 to 7, 8A and 9 are cross-sectional views illustrated along reference cross-section I-I in FIG. 3, except three gate structures are shown. FIG. 8B is a cross-sectional view illustrated along reference cross-section II-II in FIG. 3.

Figure 4:
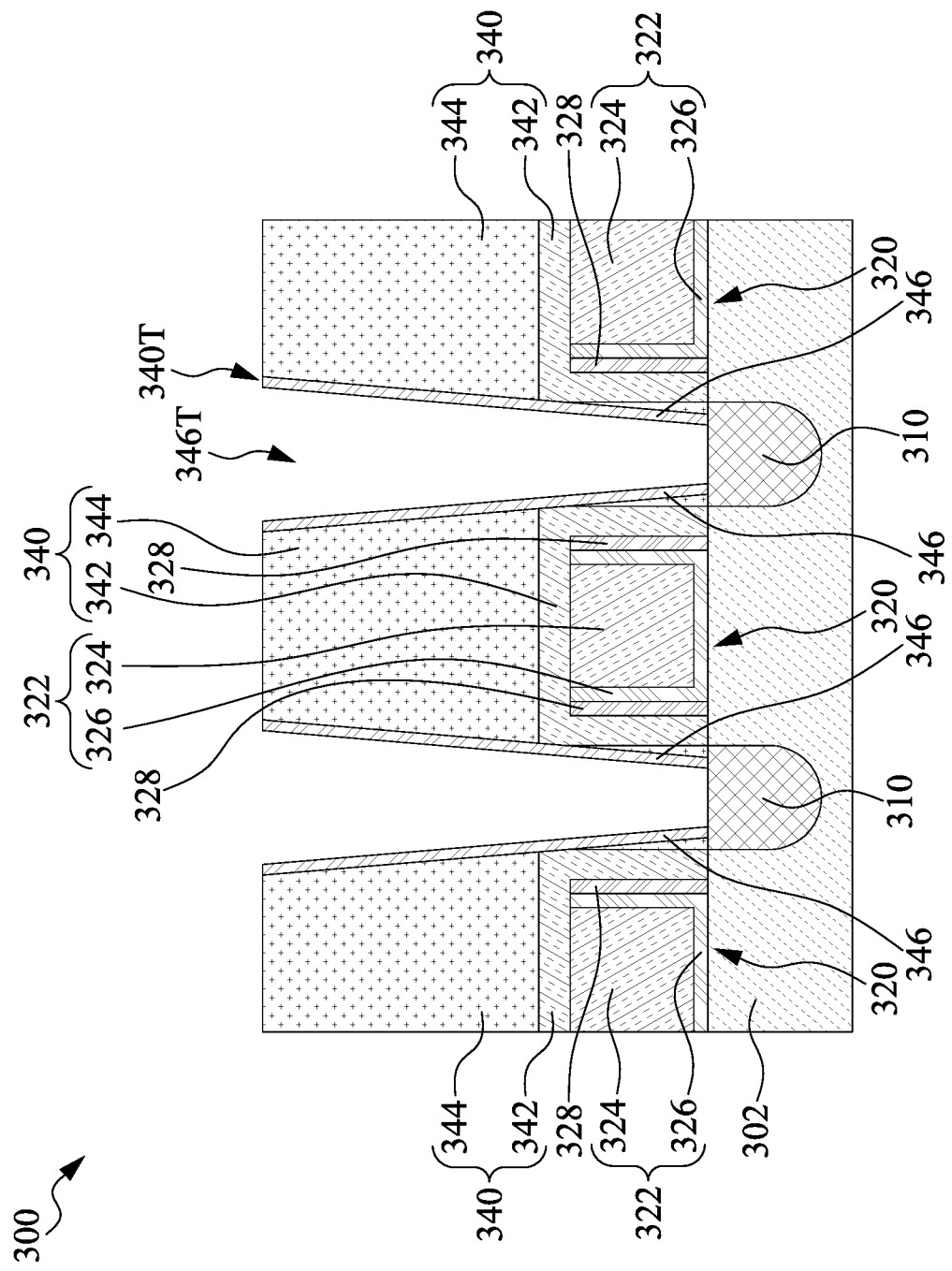
FIGS. 4-7, 8A-8B and 9 are schematic drawings illustrating a semiconductor structure at various fabrication stages constructed according to aspects of the present disclosure in one or more embodiments.

Referring to FIG. 4, in some embodiments, a dielectric structure 340 may be formed over the transistor devices 320. The dielectric structure 340 may include a protecting layer 342 and various dielectric layers (e.g., an inter-layer dielectric (ILD) layer 344) formed over the substrate 302. In some embodiments, the protecting layer 342 includes a SiN layer, a SiCN layer, a SiON layer, and/or other suitable dielectric materials. In some embodiments, the ILD layer 344 may be a low-k dielectric layer, an ultra-low-k dielectric layer, an extreme low-k dielectric layer, and/or a silicon dioxide layer. In some embodiments, after the protecting layer 342 and the ILD layer 344 are deposited, a planarization process, such as a chemical mechanical planarization (CMP) operation, may be performed to form the dielectric structure 340. In some embodiments, one or more openings 340T respectively exposing the epitaxial structures 310 may be formed after the formation of the protecting layer 342 and the ILD layer 344. In some embodiments, an aspect ratio of the openings 340T is substantially in a range between 3 and 10. An insulating layer 346 may be formed to cover exposed sidewalls of the ILD layer 344. In some embodiments, the insulating layer 346 includes a SiN layer, a SiCN layer, a SiON layer, and/or other suitable dielectric materials. In some embodiments, one or more openings 346T respectively exposing the epitaxial structures 310 may be formed after the formation of the insulating layer 346. In some embodiments, an aspect ratio of the openings 346T is substantially in a range between 3 and 10.

Figure 5:
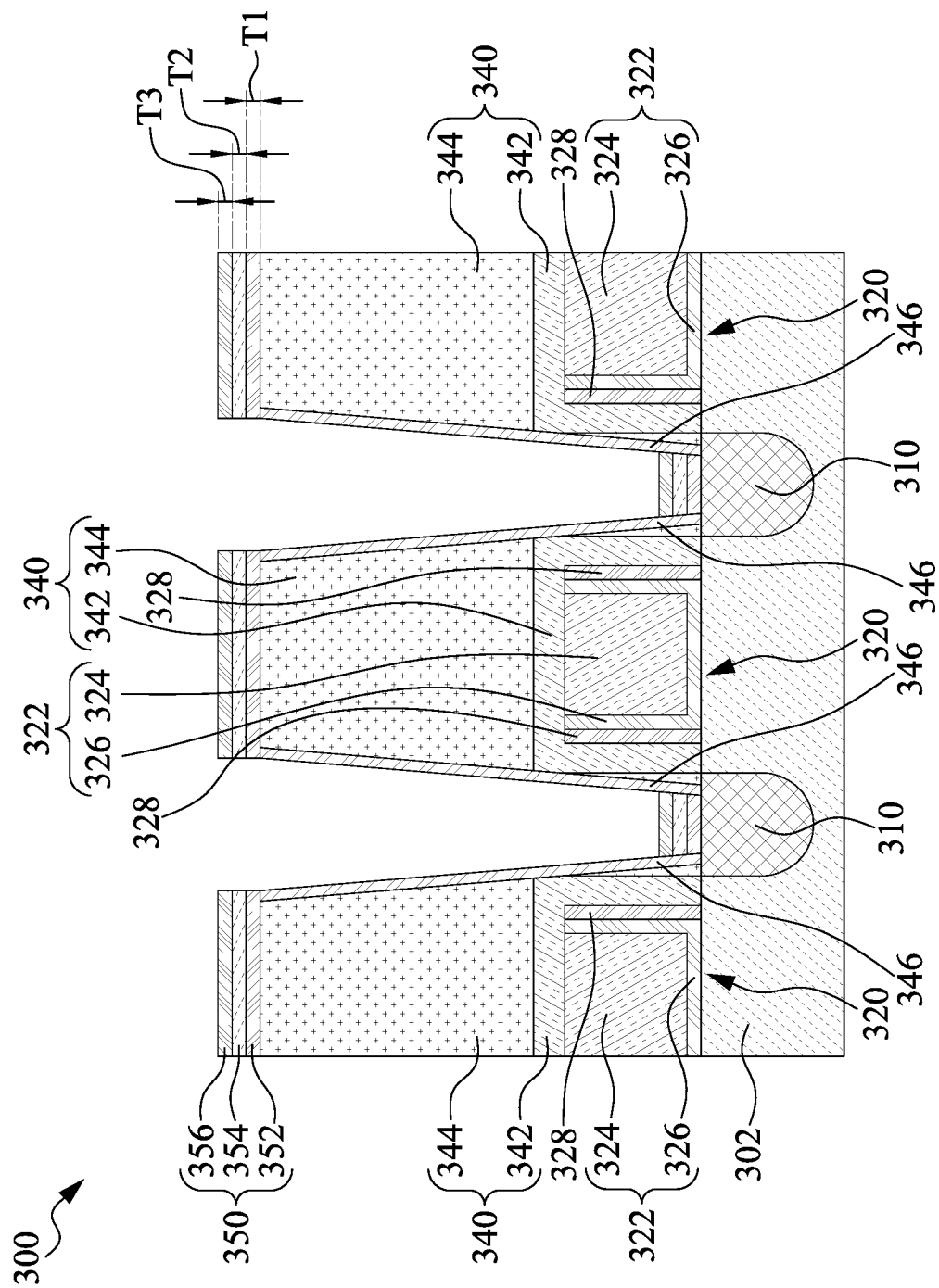

Referring to FIG. 5, in some embodiments, one or more multi-layered structures 350 are formed on the epitaxial structures 310. In some embodiments, the multi-layered structure 350 may be referred to as a metal-containing structure. The respective step is shown as the operation 104 of the method 100 in FIG. 1 or the operation 204 of the method 200 in FIG. 2. In some embodiments, the metal-containing structures 350 also are formed on exposed surfaces of the dielectric structure 340. In some embodiments, sidewalls of the dielectric structure 340 are substantially free of the metal-containing structures 350. In other words, the metal-containing structures 350 are only formed on exposed surfaces of the epitaxial structures 310 or top surfaces of the dielectric structure 340.

In some embodiments as illustrated in FIG. 5, the metal-containing structure 350 includes a first metal layer 352, a second metal layer 354 and a third metal layer 356. In some embodiments, the second metal layer 354 is disposed between the first metal layer 352 and the third metal layer 356. In some embodiments, the first metal layer 352 is interposed between the epitaxial structure 310 and the second metal layer 354. The first metal layer 352 and the third metal layer 356 may include a first metal material. The second metal layer 354 may include a second metal material different from the first metal material. In some embodiments, an atomic size (e.g., atomic radius) of the first metal material is greater than an atomic size of the second metal material. In some embodiments, the first metal material includes metal elements that are suitable for NMOS band edge. For example, the first metal material may include titanium (Ti), yttrium (Y), aluminum (Al) or other rare-earth elements. In some embodiments, the second metal material includes metal elements that are suitable for PMOS band edge. For example, the second metal material may include nickel (Ni), platinum (Pt) or cobalt (Co). The first metal material and the second metal material are selected such that the Schottky barrier height (SBH) of the resulting metal silicide layer can meet the requirements for both PFET and NFET devices.

Alternatively, the second metal layer 354 further includes a third metal material different from the first metal material or the second metal material. In some embodiments, a concentration of the third metal material in the second metal layer 354 is less than a concentration of the second metal material in the second metal layer 354. For example, the concentration of the third metal material in the second metal layer 354 is in a range of about 2% to about 10%. In some embodiments, an atomic size of the third metal material is greater than an atomic size of the second metal material. In some embodiments, the third metal material includes platinum (Pt). The third metal material is selected such that the Schottky barrier height (SBH) of the resulting metal silicide layer can meet the requirements for both PFET and NFET devices.

In some embodiments, the metal-containing structure 350 is deposited over the substrate 302 by a physical vapor deposition (PVD) operation. For example, the first metal layer 352, the second metal layer 354 and the third metal layer 356 may be deposited over the substrate 302 through a series of PVD operations. Alternatively or additionally, the metal-containing structure 350 is deposited over the substrate 302 by a chemical vapor deposition (CVD) operation, such as a plasma enhanced CVD (PECVD). For example, the formation of the metal-containing structure 350 may be achieved by adding a first compound including the first material to a second compound including the second material in which a reactant gas mixture is used. Alternatively, the formation of the metal-containing structure 350 may be achieved by adding the second compound including the second material to the first compound including the first material. Alternatively, the formation of the metal-containing structure 350 may be achieved by forming the first metal layer 352 through a PVD operation, and then forming a metal-containing layer including the first metal material and the second metal material through a CVD operation. In some embodiments, the metal-containing structure 350 is formed over the substrate 302 by an atomic layer deposition (ALD) operation. In some embodiments, the metal-containing structure 350 is formed over the substrate 302 by an ion implantation operation. For example, an ion implantation operation may be performed to implant ions of a second metal material in a metal-containing layer including the first metal material.

In some embodiments, the first metal layer 352 serves as a diffusion barrier layer during subsequent annealing operations or thermal operations. The first metal layer 352 may serve to suppress or retard diffusion of the second metal material of the second metal layer 354 into the epitaxial structure 310. In some embodiments, the third metal layer 356 serves as a sacrificial layer during the subsequent annealing operations or thermal operations. The third metal layer 356 may serve to inhibit oxidation of the second metal layer 354 during the subsequent annealing operations (e.g., formation of the metal silicide layer) or thermal operations.

In some embodiments, a sum of a thickness T1 of the first metal layer 352 and a thickness T3 of the third metal layer 356 is greater than a thickness T2 of the second metal layer 354. In some embodiments, the thickness T1 of the first metal layer 352 is greater than or substantially equal to the thickness T2 of the second metal layer 354. In some embodiments, the thickness T1 of the first metal layer 352 is greater than or substantially equal to the thickness T3 of the third metal layer 356. In some embodiments, the thickness T2 of the second metal layer 354 is greater than or substantially equal to the thickness T3 of the third metal layer 356. In some embodiments, the thickness T1 is substantially equal to the thickness T2, and the thickness T2 is substantially equal to the thickness T3. In some embodiments, the thickness T1 is substantially in a range of about 2 nanometers to about 8 nanometers. In some embodiments, the thickness T2 is substantially in a range of about 2 nanometers to about 10 nanometers. The thickness T1, the thickness T2 and the thickness T3 are selected such that the Schottky barrier height (SBH) of the resulting metal silicide layer can meet the requirements for both PFET and NFET devices.

Figure 6:
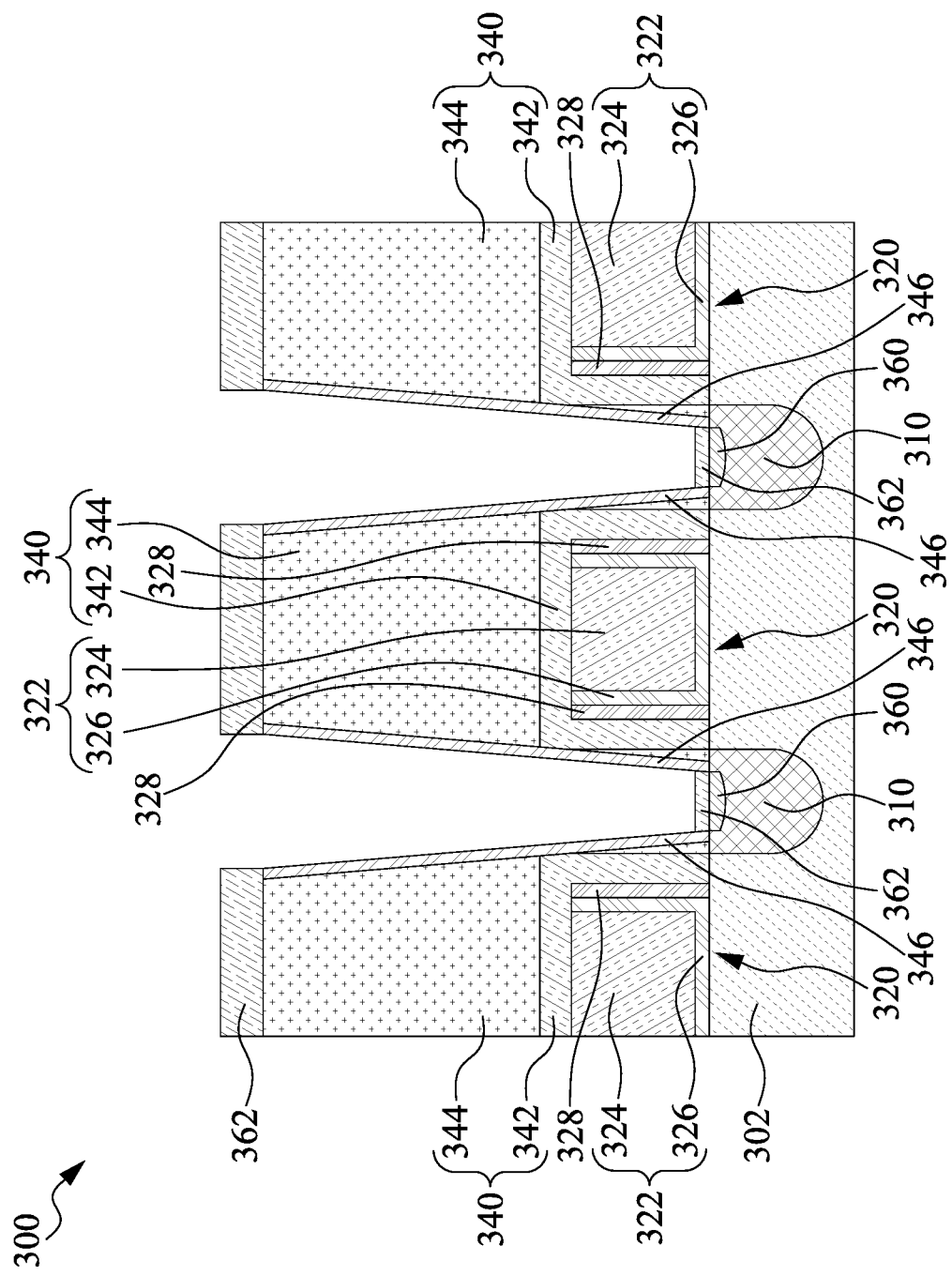

Referring to FIG. 6, in some embodiments, one or more metal silicide layers 360 are formed on the epitaxial structures 310. In some embodiments, the metal silicide layers 360 are formed by annealing the metal-containing structure 350 and the epitaxial structure 310. The respective step is shown as the operation 106 of the method 100 in FIG. 1 or the operation 206 of the method 200 in FIG. 2. The anneal operation is performed such that the first metal material and the second metal material in the metal-containing structure 350 react with the first material and the second material in the epitaxial structure 310. Thus, the metal silicide layer 360 including the first material, the second material, the first metal material and the second metal material is formed. Additionally, since four materials are involved to form the metal silicide layer 360, the metal silicide layer 360 may be referred to as a quaternary metal silicide layer. In some embodiments, in which the transistor device 320 is a PFET device, the quaternary metal silicide layer 360 includes Ni, Ti, Si and Ge. In some embodiments, in which the transistor device 320 is an NFET device, the quaternary metal silicide layer 360 includes Ni, Ti, Si and P. In some embodiments, a Schottky barrier height (SBH) of the metal silicide layer 360 is in a range of about 4.3 to about 5.0.

In some embodiments, a concentration of the first metal material in the metal silicide layer 360 varies along a thickness direction. By way of example, the concentration of the first metal material in the metal silicide layer 360 may increase along the thickness direction from a bottom surface proximal to the epitaxial structure 310 to an upper surface distal to the epitaxial structure 310. Alternatively, the concentration of the first metal material in the metal silicide layer 360 may decrease along the thickness direction from the bottom surface proximal to the epitaxial structure 310 to the upper surface distal to the epitaxial structure 310. The concentration of the first metal material in the metal silicide layer 360 may vary along the thickness direction in a continuous manner, or in a multi-stage manner.

In some embodiments, a concentration of the second metal material in the metal silicide layer 360 varies along a thickness direction. In some embodiments, the concentration of the second metal material in the metal silicide layer 360 may be inversely proportional to the concentration of the first metal material in the metal silicide layer 360. By way of example, the concentration of the first metal material in the metal silicide layer 360 may increase along the thickness direction, while the concentration of the second metal material in the metal silicide layer 360 may decrease along the thickness direction. Alternatively, the concentration of the first metal material in the metal silicide layer 360 may decrease along the thickness direction, while the concentration of the second metal material in the metal silicide layer 360 may increase along the thickness direction. The concentration of the second metal material in the metal silicide layer 360 may vary along the thickness direction in a continuous manner, or in a multi-stage manner.

Alternatively, in some embodiments in which the second metal layer includes the second metal material and the third metal material, the metal silicide layer 360 including the first material, the second material, the first metal material, the second metal material and the third metal material is formed. Additionally, since five materials are involved to form the metal silicide layer 360, the metal silicide layer 360 may be referred to as a quinary metal silicide layer. In some embodiments, in which the transistor device 320 is a PFET device, the quinary metal silicide layer 360 includes Ni, Pt, Ti, Si and Ge. In some embodiments, in which the transistor device 320 is an NFET device, the quinary metal silicide layer 360 includes Ni, Pt, Ti, Si and P. In some embodiments, a concentration of the third metal material in the metal silicide layer 360 varies along a thickness direction. In some embodiments, the concentration of the third metal material in the metal silicide layer 360 may be inversely proportional to the concentration of the first metal material in the metal silicide layer 360.

In some embodiments, a temperature of the anneal operation is greater than or substantially equal to 400° C., but the disclosure is not limited thereto. In some embodiments, a temperature of the anneal operation is between about 220° C. and about 450° C., but the disclosure is not limited thereto. The temperature of the anneal operation is selected such that the resulting metal silicide layer can meet the requirements for both PFET and NFET devices. Additionally, the temperature of the anneal operation is selected such that the thermal budget of the anneal operation is compatible with subsequent high-temperature thermal operations, including diffusion, oxidation, deposition, and annealing, in both standard furnace and rapid thermal processing. In other words, the metal silicide layer 360 is thermally stabile during subsequent high-temperature thermal operations.

In some embodiments, the formation of the metal silicide layer 360 may include multiple intermediate stages. In a first intermediate stage, the first metal material of the first metal layer 352 may initially react with the first material and the second material in the epitaxial structure 310 to form a first intermediate metal silicide layer. Thus, the first intermediate metal silicide layer includes the first material, the second material and the first metal material. Additionally, since three materials are involved to form the first intermediate metal silicide layer, the first intermediate metal silicide layer may be referred to as a tertiary metal silicide layer. The tertiary metal silicide layer may comprise Ti, Si and Ge or Ti, Si and P, but the present disclosure is not limited thereto.

In some embodiments, in the first intermediate stage, the second metal material of the second metal layer 354 may diffuse into and react with the first metal material of the first metal layer 352 to form a first metal alloy layer. The first metal alloy layer may include Ti and Ni, but the present disclosure is not limited thereto. In some embodiments, in the first intermediate stage, the second metal material of the second metal layer 354 may diffuse into and react with the first metal material of the third metal layer 356 to form a second metal alloy layer. The second metal alloy layer may include Ti and Ni, but the present disclosure is not limited thereto. In some embodiments, in which the second metal layer 354 includes the second metal material and the third metal material, the second metal material and the third material of the second metal layer 354 may also diffuse into and react with the first metal layer 352 to form a third metal alloy layer in the first intermediate stage. The third metal alloy layer may include Ti, Ni and Pt, but the present disclosure is not limited thereto.

In a second intermediate stage, the second metal material of the second metal layer 354 may diffuse into and react with the first intermediate metal silicide layer to form a second intermediate metal silicide layer. Thus, the second intermediate metal silicide layer includes the first material, the second material, the first metal material and the second metal material. Additionally, since four materials are involved to form the second intermediate metal silicide layer, the second intermediate metal silicide layer may be referred to as a quaternary metal silicide layer. The quaternary metal silicide layer may include Ni, Ti, Si and Ge or Ni, Ti, Si and P, but the present disclosure is not limited thereto. In some alternative embodiments, in the second intermediate stage, the first metal alloy layer (including, for example, Ti and Ni) may diffuse into and react with the first intermediate metal silicide layer to form the second intermediate metal silicide layer.

Alternatively, in some embodiments, in which the second metal layer includes the second metal material and the third metal material, both of the second metal material and the third metal material of the second metal layer 354 may diffuse into and react with the first intermediate metal silicide layer to form the second intermediate metal silicide layer. The second intermediate metal silicide layer includes the first material, the second material, the first metal material, the second metal material and the third metal material. Additionally, since five materials are involved to form the second intermediate metal silicide layer, the second intermediate metal silicide layer may be referred to as a quinary metal silicide layer. The quaternary metal silicide layer may include Ni, Pt, Ti, Si and Ge or Ni, Pt, Ti, Si and P, but the present disclosure is not limited thereto. In some alternative embodiments, in the second intermediate stage, the third metal alloy layer (including, for example, Ti, Ni and Pt) may diffuse into and react with the first intermediate metal silicide layer to form the second intermediate metal silicide layer.

In some embodiments, during the anneal operation or the first intermediate stage, the first metal layer 352 serves as a diffusion barrier layer. The first metal material in the first metal layer 352 may suppress or obstruct diffusing paths of the second metal material (or the third metal material) of the second metal layer 354 into the epitaxial structure 310 and thus suppress metal diffusion or extrusion. In some embodiments, the presence of the third metal layer 356 may provide additional diffusing paths of the second metal material (or the third metal material) of the second metal layer 354 into the third metal layer 356, thus reducing the amount of the second metal material diffusing into the epitaxial structure 310. In some embodiments where the first metal layer 352 is absent, a meta-stable metal silicide (including, for example, Ni, Si and P or Ni, Si and Ge) may be formed.

The present disclosure provides embodiments of methods for manufacturing a semiconductor structure that provide one or more improvements over existing approaches. The presence of the first metal layer 352 may reduce the formation of the meta-stable metal silicide. By reducing the formation of meta-stable metal silicide, the metal silicide layer 360 may exhibit improved performance in post back-end-of-line (BEOL) thermal operations or other annealing operations. Further, since the first metal material has a larger atomic size than the second metal material, the first metal material in the first metal layer 352 is able to obstruct metal extrusion or metal spiking of the meta-stable metal silicide. In other words, the first metal layer 352 can suppress diffusion/extrusion of the second metal material, and thus the metal silicide layer 360 provides improved thermal stability and reliability. Furthermore, during the anneal operation, the first intermediate stage or the second intermediate stage, the third metal layer 356 serves as a sacrificial layer. The third metal layer 356 may suppress or inhibit oxidation of the second metal layer 354. Accordingly, the metal silicide layer 360 may be more stable, and has lower resistance due to less oxidation.

In some embodiments, after the annealing operation, at least a portion of the metal-containing structure 350 is unreacted with the epitaxial structure 310. The portion of the metal-containing structure 350 may be referred to as an unreacted metal structure 362. In some embodiments, although the metal-containing structures 350 over the dielectric structure 340 do not react with the epitaxial structure 310 during the annealing operation, the first metal material in the first metal layer 352, the second metal material (or the third metal material) in the second metal layer 354, and the first metal material in the third metal layer 356 may interdiffuse (i.e, diffuse mutually) or intermix with each other. Accordingly, homogenous or uniform (i.e., without interfaces) metal structures 362 over the dielectric structure 340 may be obtained.

Figure 7:
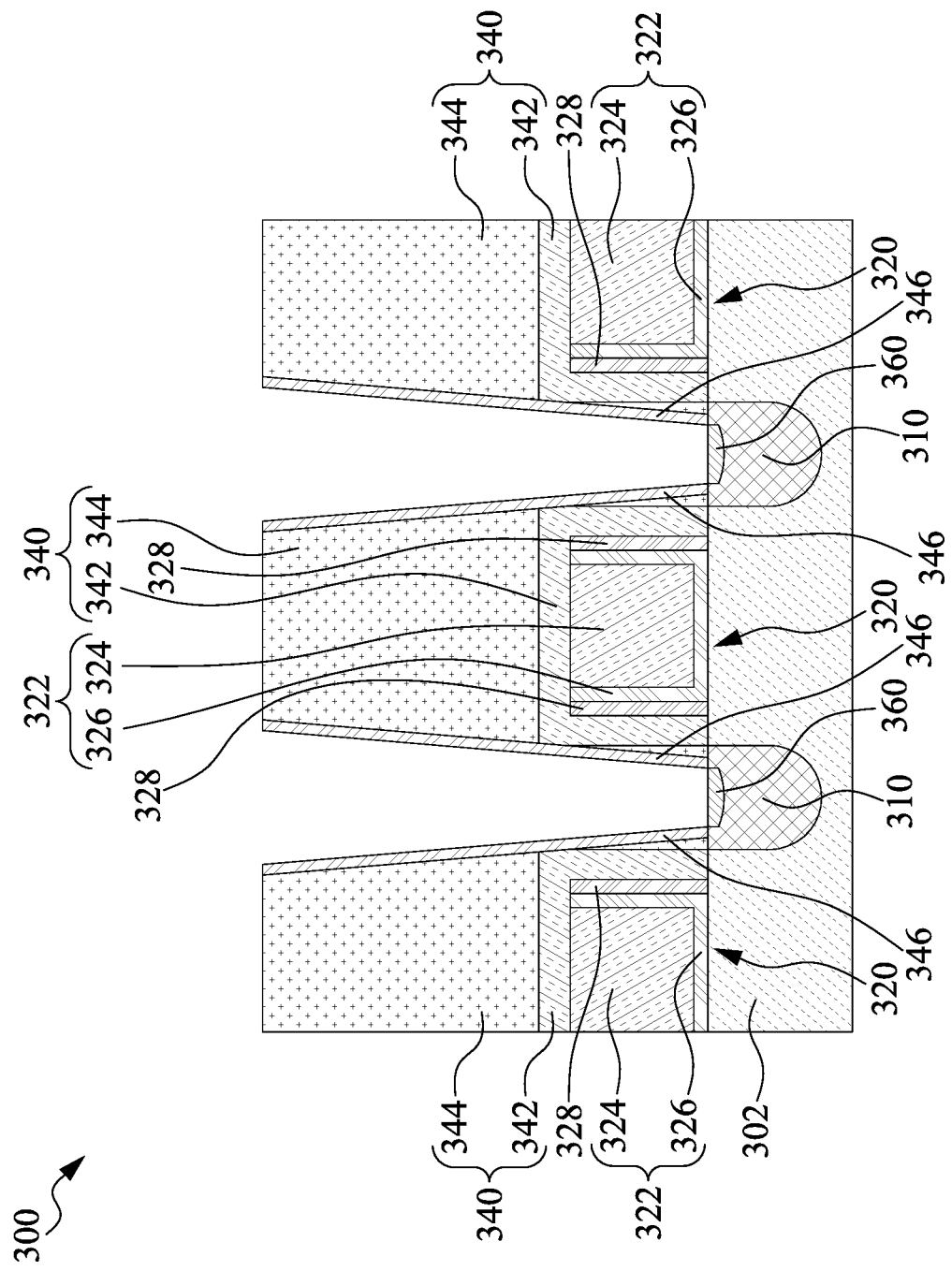

Referring to FIG. 7, in some embodiments, after the formation of the metal silicide layer 360, the unreacted metal structures 362 are removed from the substrate 302. Additionally, the unreacted metal structures 362 are removed from the dielectric structure 340. In some embodiments, the removal of the unreacted metal structures 362 includes a wet stripping operation. In some embodiments, the metal silicide layer 360 remains intact after the performing of the wet stripping operation. In some embodiments, the metal silicide layer 360 has improved wet strip resistance than the meta-stable metal silicide.

In some embodiments, a thickness of the metal silicide layer 360 is in a range of about 3 nanometers to about 20 nanometers. In some embodiments, the thickness of the metal silicide layer 360 is selected such that the metal silicide layer can provide reduced resistance in both PFET and NFET devices and prevent metal extrusion. In some embodiments, due to the variation of the thicknesses T1, T2 and T3, and the performing of the annealing operation and/or the wet stripping operation, different metal silicide layers 360 that include different concentrations of the first metal material and the second metal material may be formed. In some embodiments where an overall concentration of the second metal material in the metal silicide layer 360 is greater than an overall concentration of the first metal material in the metal silicide layer 360 (e.g., a Ni-rich metal silicide layer), the thickness of the metal silicide layer 360 is in a range of about 3 nanometers to about 20 nanometers. In some embodiments where the overall concentration of the second metal material in the metal silicide layer 360 is substantially equal to the overall concentration of the first metal material in the metal silicide layer 360, the thickness of the metal silicide layer 360 is in a range of about 3 nanometers to about 11 nanometers. In some embodiments where the overall concentration of the second metal material in the metal silicide layer 360 is less than the overall concentration of the first metal material in the metal silicide layer 360 (e.g., a Ti-rich metal silicide layer), the thickness of the metal silicide layer 360 is in a range of about 3 nanometers to about 8 nanometers.

Figure 8A:
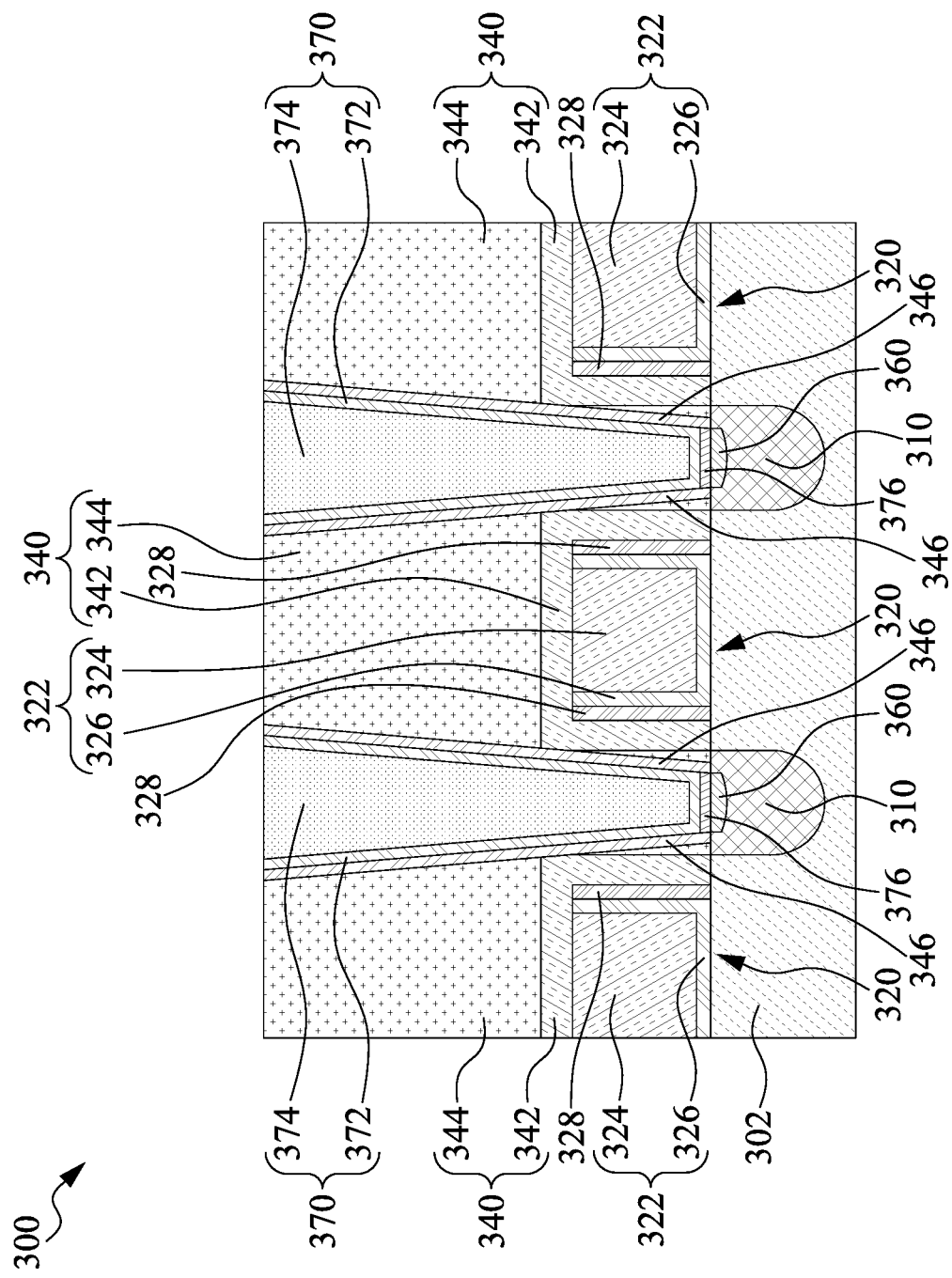
Figure 8B:
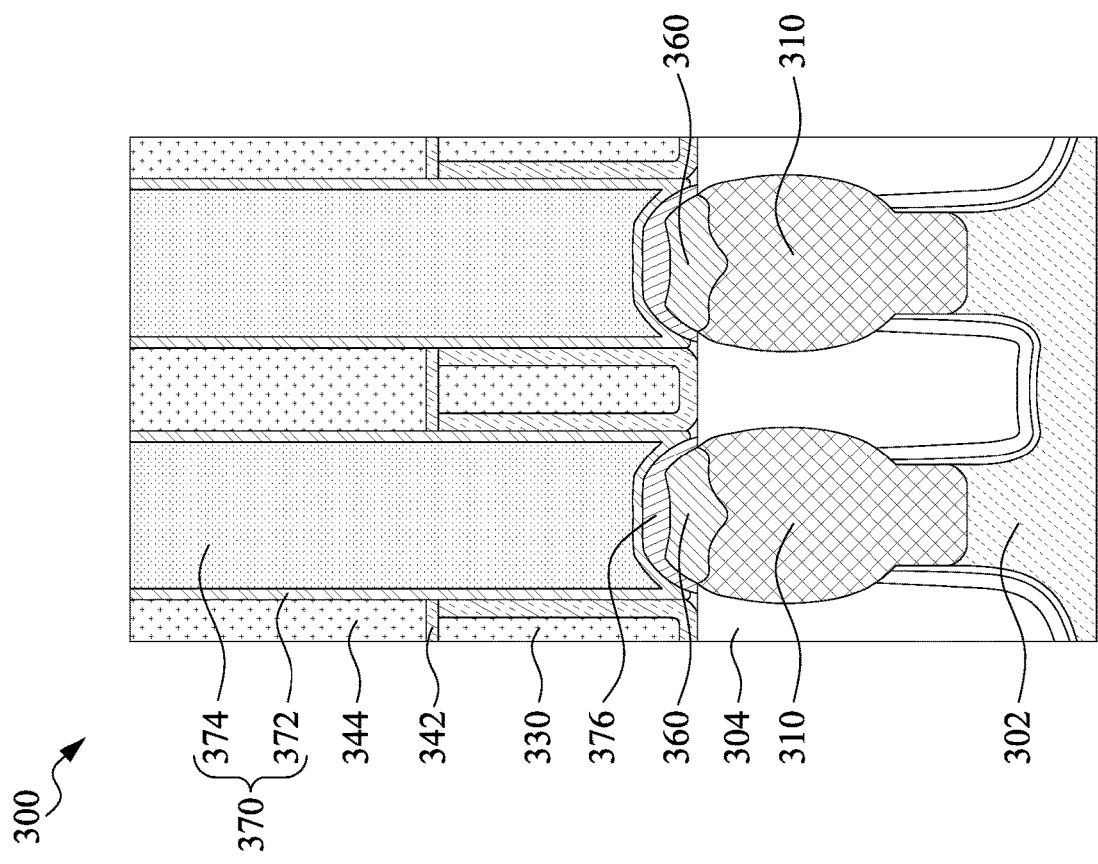

Referring to FIGS. 8A and 8B, in some embodiments, one or more contact plugs (also referred to as conductive plugs) 370 are formed in the dielectric structure 340 and over the epitaxial structure 310. In some embodiments, the contact plug 370 is disposed on and contacts the metal silicide layer 360. In some embodiments, prior to the formation of the contact plugs 370, one or more capping layers 376 may be formed over the metal silicide layers 360. In such embodiments, the contact plug 370 is disposed on and contacts the capping layer 376. The capping layer 376 may serve to protect the metal silicide layer 360. For example, the capping layer 376 may serve to inhibit oxidation of the metal silicide layer 360. The contact plug 370 may be a multi-layered structure. For example, the contact plug 370 may include a barrier metal layer 372 and a gap-filling metal layer 374. The barrier metal layer 372 may include, for example but not limited thereto, TiN. The gap-filling metal layer 374 may include conductive material such as Al, Cu, AlCu, W or Co, but is not limited to the above-mentioned materials.

Figure 9:
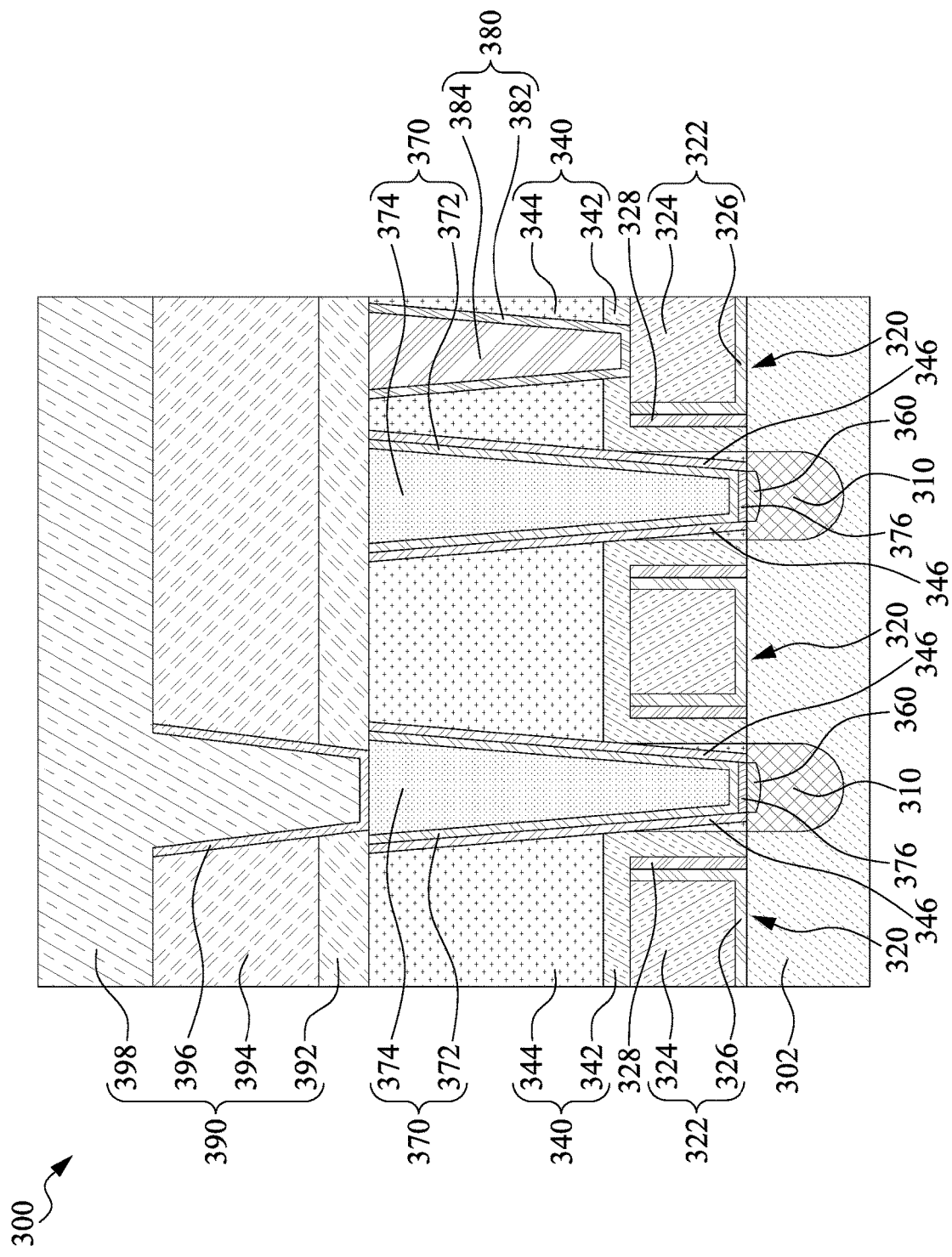

Referring to FIG. 9, in some embodiments, one or more gate vias 380 are formed in the dielectric structure 340 and over the gate structure 322. In some embodiments, the gate via 380 is disposed on and contacts the gate structure 322. The gate via 380 may be a multi-layered structure. For example, the gate via 380 may include a barrier metal layer 382 and a gap-filling metal layer 384. The barrier metal layer 382 may include, for example but not limited thereto, TiN. The gap-filling metal layer 384 may include conductive material such as Al, Cu, AlCu, W or Co, but is not limited to the above-mentioned materials.

Thereafter, an interconnect structure 390 is formed over the substrate 302. In some embodiments, the interconnect structure 390 includes an etch-stop layer (ESL) 392, an inter-metal dielectric (IMD) layer 394 formed over the ESL 392, one or more barrier layer 396 and one or more metal lines (or metal vias) 398. In some embodiments, the ESL 392 includes SiN, SiC, or other dielectric materials. The IMD layer 394 may include, for example, one or more layers of an oxide, a low-k dielectric, or an ultra-low-k dielectric. The barrier layer 396 may include, for example, TiN. The metal lines (or metal vias) 398 may include, for example, Al, Cu, AlCu, W or Co. In some embodiments, the contact plug 370 may be configured to electrically couple the epitaxial structure 310 to the metal line 398.

The structures and methods of the present disclosure are not limited to the above-mentioned embodiments and may have other different embodiments. To simplify the description and for convenience of comparison between each of the embodiments of the present disclosure, identical (or like) components in each of the following embodiments are marked with identical (or like) numerals. For making it easier to compare differences between the embodiments, the following description will detail dissimilarities among different embodiments, while identical features, values and definitions will not be repeated.

Figure 10:
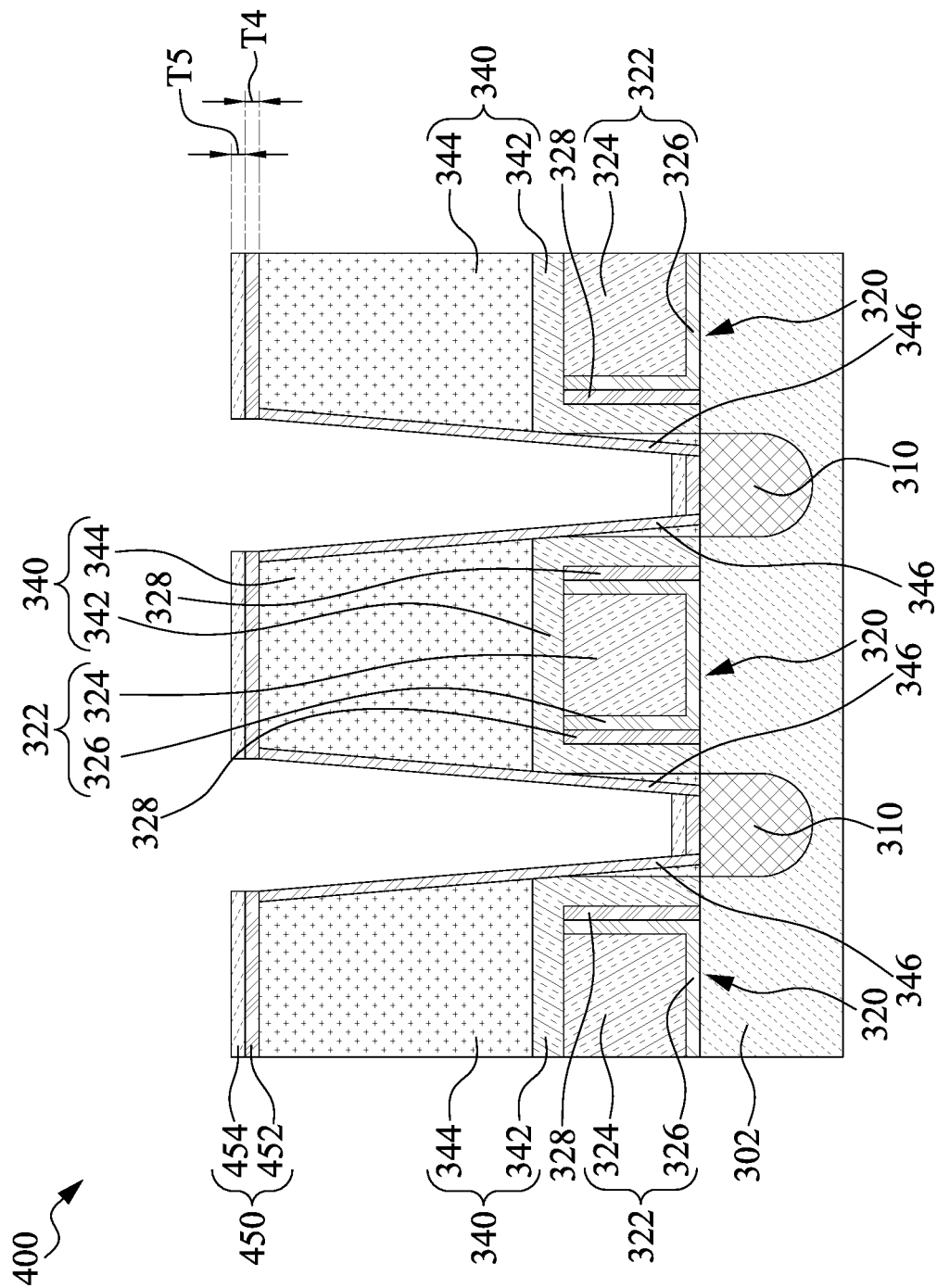
FIGS. 10-13 are schematic drawings illustrating a semiconductor structure at various fabrication stages constructed according to aspects of the present disclosure in one or more embodiments.

FIGS. 10 to 13 are schematic drawings illustrating a semiconductor structure 400 at various fabrication stages constructed according to aspects of the present disclosure in one or more embodiments. FIGS. 10 to 13 are cross-sectional views illustrated along reference cross-section I-I in FIG. 3, except three gate structures are shown. Referring to FIG. 10, in some embodiments, one or more multi-layered structures 450 are formed on the epitaxial structures 310. In some embodiments, the multi-layered structure 450 may be referred to as a metal-containing structure. The respective step is shown as the operation 204 of the method 200 in FIG. 2. In some embodiments, the metal-containing structures 450 are also formed on exposed surfaces of the dielectric structure 340. In some embodiments, sidewalls of the dielectric structure 340 are substantially free of the metal-containing structures 450.

In some embodiments as illustrated in FIG. 10, the metal-containing structure 450 includes a first metal layer 452 and a second metal layer 454. In some embodiments, the second metal layer 454 is disposed over the first metal layer 452. The first metal layer 352 may include a first metal material. The second metal layer 354 may include a second metal material different from the first metal material. In some embodiments, an atomic size of the first metal material is greater than an atomic size of the second metal material. In some embodiments, the first metal material includes titanium (Ti), and the second metal material includes nickel (Ni), but the present disclosure is not limited thereto. In some embodiments, a thickness T4 of the first metal layer 452 is greater than or substantially equal to a thickness T5 of the second metal layer 454. The first metal material, the second metal material, the thickness T4 and the thickness T5 are selected such that the Schottky barrier height (SBH) of the resulting metal silicide layer can meet the requirements for both PFET and NFET devices.

Alternatively, the second metal layer 454 further includes a third metal material different from the first metal material or the second metal material. In some embodiments, a concentration of the third metal material in the second metal layer 454 is less than a concentration of the second metal material in the second metal layer 454. For example, the concentration of the third metal material in the second metal layer 454 is in a range of about 2% to about 10%. In some embodiments, an atomic size of the third metal material is greater than an atomic size of the second metal material. In some embodiments, the third metal material includes platinum (Pt). The third metal material is selected such that the Schottky barrier height (SBH) of the resulting metal silicide layer can meet the requirements for both PFET and NFET devices.

In some embodiments, the metal-containing structure 450 is deposited over the substrate 302 by a physical vapor deposition (PVD) operation. For example, the first metal layer 452 and the second metal layer 454 may be deposited over the substrate 302 through a series of PVD operations. Alternatively or additionally, the metal-containing structure 450 is deposited over the substrate 302 by a chemical vapor deposition (CVD) operation. For example, the formation of the metal-containing structure 450 may be achieved by adding the second compound including the second material to the first compound including the first material. In some embodiments, the metal-containing structure 450 is formed over the substrate 302 by an ion implantation operation. For example, the ion implantation operation may be performed to implant ions of a second metal material in a metal-containing layer including the first metal material.

Figure 11:
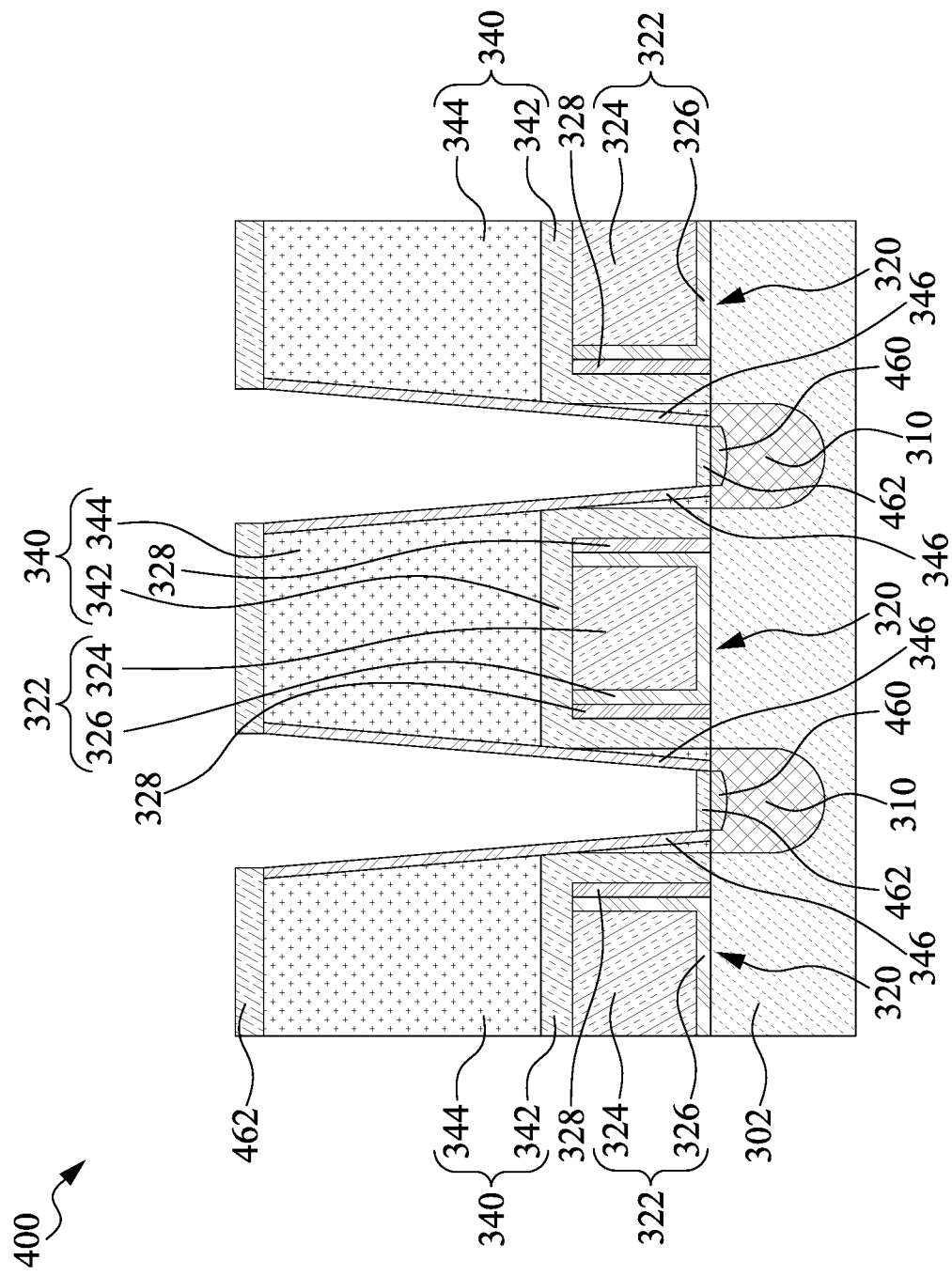

Referring to FIG. 11, in some embodiments, one or more metal silicide layers 460 are formed on the epitaxial structures 310. In some embodiments, the metal silicide layers 460 are formed by annealing the metal-containing structure 450 and the epitaxial structure 310. The respective step is shown as the operation 206 of the method 200 in FIG. 2. The anneal operation is performed such that the first metal material and the second metal material in the metal-containing structure 450 react with the first material and the second material in the epitaxial structure 310. Thus, the metal silicide layer 460 including the first material, the second material, the first metal material and the second metal material is formed. Additionally, since four materials are involved to form the metal silicide layer 460, the metal silicide layer 460 may be referred to as a quaternary metal silicide layer. In some embodiments, in which the transistor device 320 is a PFET device, the quaternary metal silicide layer 460 includes Ni, Ti, Si and Ge. In some embodiments, in which the transistor device 320 is an NFET device, the quaternary metal silicide layer 460 includes Ni, Ti, Si and P. In some embodiments, a Schottky barrier height (SBH) of the metal silicide layer 460 is in a range of about 4.3 to about 5.0.

In some embodiments, a concentration of the first metal material in the metal silicide layer 460 varies along a thickness direction. By way of example, the concentration of the first metal material in the metal silicide layer 460 may increase along the thickness direction from a bottom surface proximal to the epitaxial structure 310 to an upper surface distal to the epitaxial structure 310. Alternatively, the concentration of the first metal material in the metal silicide layer 460 may decrease along the thickness direction from the bottom surface proximal to the epitaxial structure 310 to the upper surface distal to the epitaxial structure 310. The concentration of the first metal material in the metal silicide layer 460 may vary along the thickness direction in a continuous manner, or in a multi-stage manner. In some embodiments, a concentration of the second metal material in the metal silicide layer 460 varies along a thickness direction. In some embodiments, the concentration of the second metal material in the metal silicide layer 460 may be inversely proportional to the concentration of the first metal material in the metal silicide layer 460.

Alternatively, in some embodiments, in which the second metal layer includes the second metal material and the third metal material, the metal silicide layer 460 including the first material, the second material, the first metal material, the second metal material and the third metal material is formed. Additionally, since five materials are involved to form the metal silicide layer 460, the metal silicide layer 460 may be referred to as a quinary metal silicide layer. In some embodiments, in which the transistor device 320 is a PFET device, the quinary metal silicide layer 460 includes Ni, Pt, Ti, Si and Ge. In some embodiments, in which the transistor device 320 is an NFET device, the quinary metal silicide layer 460 includes Ni, Pt, Ti, Si and P. In some embodiments, a concentration of the third metal material in the metal silicide layer 460 varies along a thickness direction. In some embodiments, the concentration of the third metal material in the metal silicide layer 460 may be inversely proportional to the concentration of the first metal material in the metal silicide layer 460.

In some embodiments, a temperature of the anneal operation is greater than or substantially equal to 400° C., but the disclosure is not limited thereto. In some embodiments, a temperature of the anneal operation is between about 220° C. and about 450° C., but the disclosure is not limited thereto. The temperature of the anneal operation is selected such that the resulting metal silicide layer 460 can meet the requirements for both PFET and NFET devices. Additionally, the temperature of the anneal operation is selected such that the thermal budget of the anneal operation is compatible with subsequent high-temperature thermal operations, including diffusion, oxidation, deposition, and annealing, in both standard furnace and rapid thermal processing. In other words, the metal silicide layer 460 is thermally stabile during subsequent high-temperature thermal operations.

In some embodiments, during the anneal operation, the first metal layer 452 serves as a diffusion barrier layer. The first metal material in the first metal layer 452 may suppress or obstruct diffusing paths of the second metal material (or the third metal material) of the second metal layer 454 into the epitaxial structure 310 and thus suppress metal diffusion or extrusion. In some embodiments where the first metal layer 452 is absent, a meta-stable metal silicide (e.g., Ni—Si—P or Ni—Si—Ge) may be formed.

The present disclosure provides embodiments of methods for manufacturing a semiconductor structure that provide one or more improvements over existing approaches. The presence of the first metal layer 452 may reduce the formation of the meta-stable metal silicide. By reducing the formation of meta-stable metal silicide, the metal silicide layer 460 may exhibit improved performance in post back-end-of-line (BEOL) thermal operations or other annealing operations. Further, since the first metal material has larger atomic size than the second metal material, the first metal material in the first metal layer 452 is able to obstruct metal extrusion or metal spiking of the meta-stable metal silicide. In other words, the first metal layer 452 can suppress diffusion/extrusion of the second metal material, and thus the metal silicide layer 460 exhibits improved thermal stability and reliability.

In some embodiments, after the annealing operation, at least a portion of the metal-containing structure 450 is unreacted with the epitaxial structure 310. The portion of the metal-containing structure 450 may be referred to as an unreacted metal structure 462. In some embodiments, although the metal-containing structures 450 over the dielectric structure 340 do not react with the epitaxial structure 310 during the annealing operation, the first metal material in the first metal layer 452 and the second metal material (or the third metal material) in the second metal layer 454 may interdiffuse (i.e, diffuse mutually) or intermix with each other. Accordingly, homogenous or uniform (i.e., without interfaces) metal structures 462 over the dielectric structure 340 may be obtained.

Figure 12:
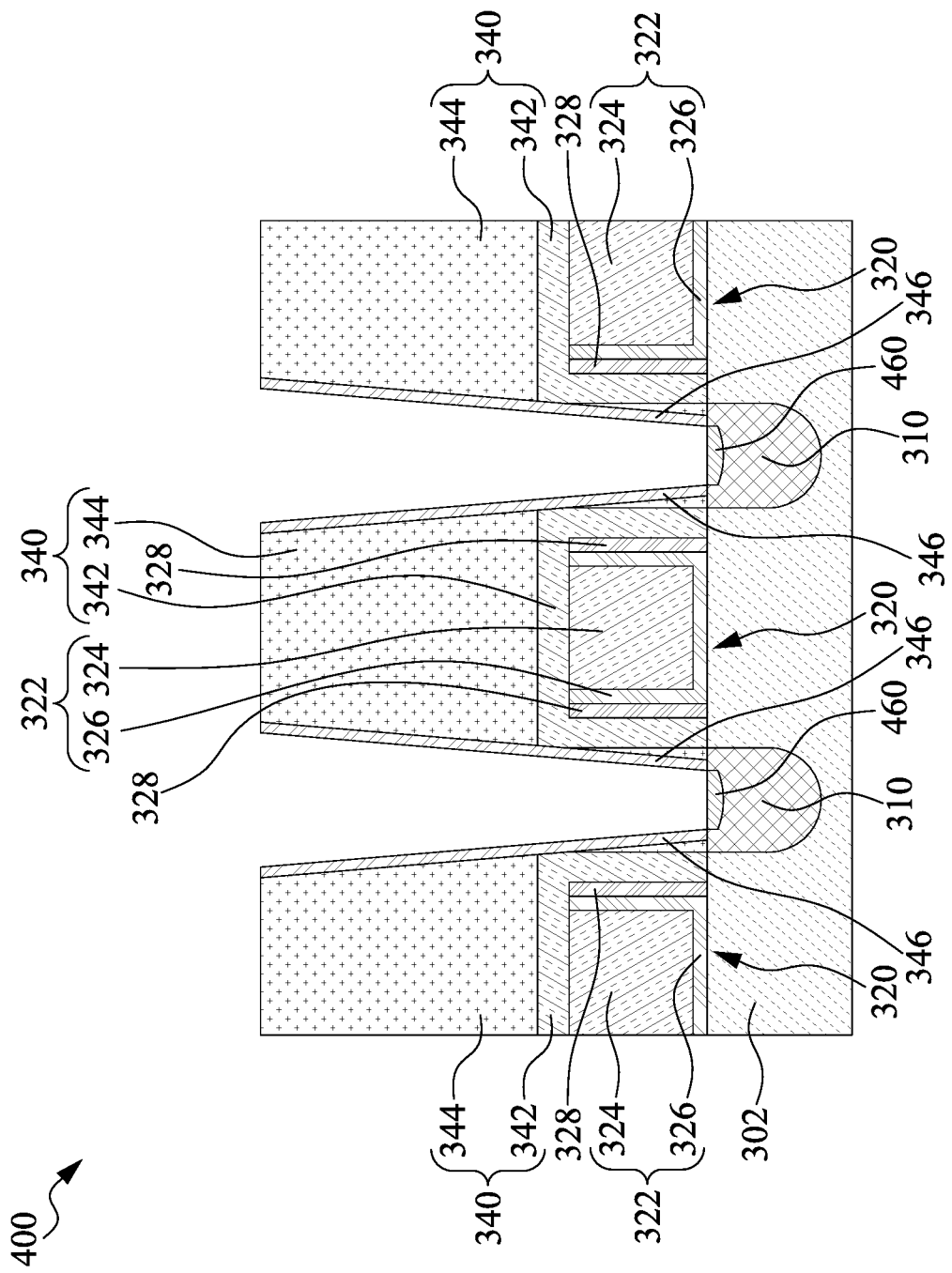

Referring to FIG. 12, in some embodiments, after the formation of the metal silicide layer 460, the unreacted metal structures 462 are removed from the substrate 302. Additionally, the unreacted metal structures 462 are removed from the dielectric structure 340. In some embodiments, the removal of the unreacted metal structures 462 includes a wet stripping operation. In some embodiments, the metal silicide layer 460 remains intact after the performing of the wet stripping operation. In some embodiments, the metal silicide layer 460 exhibits improved wet strip resistance compared to the meta-stable metal silicide.

Figure 13:
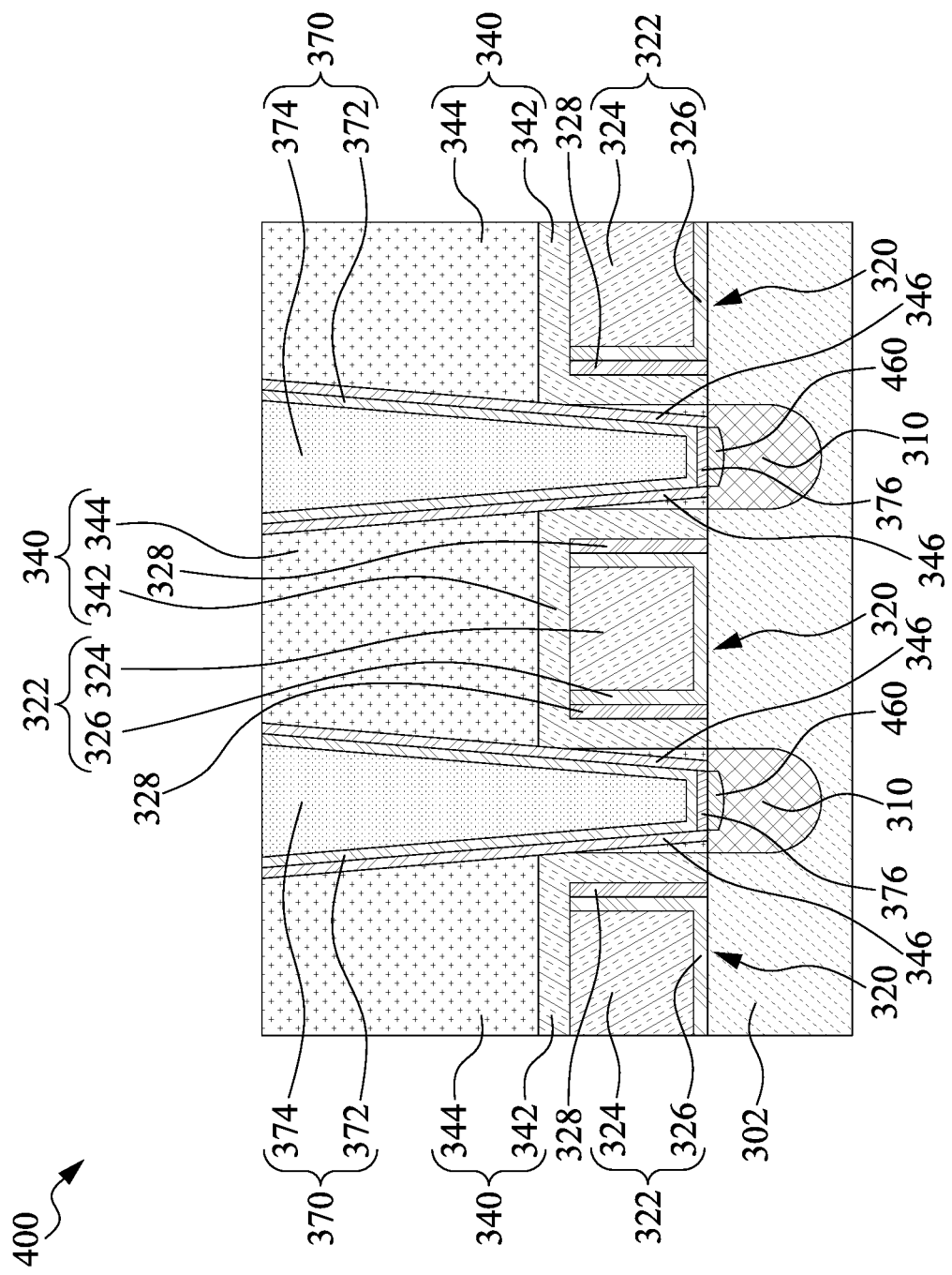

Referring to FIG. 13, in some embodiments, one or more contact plugs 370 are formed in the dielectric structure 340 and over the epitaxial structure 310. In some embodiments, the contact plug 370 is disposed on and contacts the metal silicide layer 460. In some embodiments, prior to the formation of the contact plugs 370, one or more capping layers 376 may be formed over the metal silicide layers 460. In such embodiments, the contact plug 370 is disposed on and contacts the capping layer 376. The capping layer 376 may serve to protect the metal silicide layer 460. For example, the capping layer 376 may serve to inhibit oxidation of the metal silicide layer 460. Accordingly, the metal silicide layer 460 may be more stable, and has lower resistance due to less oxidation. The contact plug 370 may be a multi-layered structure. For example, the contact plug 370 may include a barrier metal layer 372 and a gap-filling metal layer 374. The barrier metal layer 372 may include, for example but not limited thereto, TiN. The gap-filling metal layer 374 may include conductive material such as Al, Cu, AlCu, W or Co, but is not limited to the above-mentioned materials.

The present disclosure provides embodiments of a semiconductor structure and methods for manufacturing the semiconductor structure. By forming a metal silicide layer as introduced above, diffusion/extrusion or spiking defects may be mitigated. Accordingly, stability and reliability of the metal silicide layers and transistor devices are improved.

In accordance with some embodiments of the present disclosure, a method for forming a semiconductor structure is provided. The method includes the following operations. An epitaxial structure including a first material and a second material is provided. A metal-containing structure is deposited on the epitaxial structure. The metal-containing structure includes a first metal layer, a second metal layer and a third metal layer. The first metal layer and the third metal layer include a first metal material. The second metal layer includes a second metal material. The second metal layer is disposed between the first metal layer and the third metal layer. The metal-containing structure and the epitaxial structure are annealed to form a metal silicide layer on the epitaxial structure. The metal silicide layer includes the first material, the second material, the first metal material and the second metal material. A concentration of the first metal material in the metal silicide layer varies along a thickness direction.

In accordance with some embodiments of the present disclosure, a method for forming a semiconductor structure is provided. The method includes the following operations. An epitaxial structure including a semiconductor material is provided. A multi-layered structure is formed on the epitaxial structure. The multi-layered structure includes a diffusion barrier layer and a metal layer. The diffusion barrier layer includes a first metal material, and the metal layer includes a second metal material, wherein the diffusion barrier layer is interposed between the epitaxial structure and the metal layer. A metal silicide layer is formed on the epitaxial structure. The metal silicide layer includes the semiconductor material, the first metal material and the second metal material. A concentration of the second metal material in the metal silicide layer varies along a thickness direction.

In accordance with some embodiments of the present disclosure, a semiconductor structure is provided. The semiconductor structure includes an epitaxial structure, a metal silicide layer, a conductive plug and a capping layer. The epitaxial structure includes a semiconductor material. The metal silicide layer is disposed on the epitaxial structure. The metal silicide layer includes the semiconductor material, a first metal material and a second metal material. An atomic size of the first metal material is greater than an atomic size of the second metal material, and a concentration of the first metal material in the metal silicide layer varies along a thickness direction. The conductive plug is disposed on the metal silicide layer. The capping layer is between the conductive plug and the metal silicide layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    providing an epitaxial structure comprising a first material and a second material;
    depositing a metal-containing structure on the epitaxial structure, the metal-containing structure comprising a first metal layer, a second metal layer and a third metal layer, the first metal layer and the third metal layer comprising a first metal material, and the second metal layer comprising a second metal material, wherein the second metal layer is disposed between the first metal layer and the third metal layer; and
    annealing the metal-containing structure and the epitaxial structure to form a metal silicide layer on the epitaxial structure, the metal silicide layer comprising the first material, the second material, the first metal material and the second metal material, wherein a concentration of the first metal material in the metal silicide layer varies along a thickness direction, and the concentration of the first metal material in the metal silicide layer varies along the thickness direction in a continuous manner.

2. The method of claim 1, wherein a sum of a thickness of the first metal layer and a thickness of the third metal layer is greater than a thickness of the second metal layer.

3. The method of claim 1, wherein the concentration of the first metal material in the metal silicide layer increases along the thickness direction from a bottom surface proximal to the epitaxial structure to an upper surface distal to the epitaxial structure.

4. The method of claim 1, wherein the concentration of the first metal material in the metal silicide layer decreases along the thickness direction from a bottom surface proximal to the epitaxial structure to an upper surface distal to the epitaxial structure.

5. The method of claim 1, wherein a concentration of the second metal material in the metal silicide layer varies along the thickness direction.

6. The method of claim 1, further comprising forming a contact plug over the epitaxial structure.

7. The method of claim 1, wherein the first material comprises silicon (Si), and the second material comprises germanium (Ge) or phosphorous (P).

8. The method of claim 1, wherein the first metal material comprises titanium (Ti), yttrium (Y), or aluminum (Al), and the second metal material comprises nickel (Ni), platinum (Pt) or cobalt (Co).

9. The method of claim 1, wherein a temperature of the anneal is greater than 400° C.

10. The method of claim 1, wherein a Schottky barrier height (SBH) of the metal silicide layer is in a range of about 4.3 to about 5.0.

11. A method for manufacturing a semiconductor structure, comprising:
    providing an epitaxial structure comprising a semiconductor material;
    forming a multi-layered structure on the epitaxial structure, the multi-layered structure comprising a diffusion barrier layer and a metal layer, the diffusion barrier layer comprising a first metal material, and the metal layer comprising a second metal material, wherein the diffusion barrier layer is interposed between the epitaxial structure and the metal layer; and
    forming a metal silicide layer on the epitaxial structure, the metal silicide layer comprising the semiconductor material, the first metal material and the second metal material, wherein a concentration of the second metal material in the metal silicide layer varies along a thickness direction.

12. The method of claim 11, wherein the multi-layered structure further comprises a sacrificial layer disposed over the metal layer, and the sacrificial layer serves to inhibit oxidation of the metal layer during the formation of the metal silicide layer.

13. The method of claim 11, wherein an atomic size of the first metal material is greater than an atomic size of the second metal material.

14. The method of claim 11, wherein the metal layer further comprises a third metal material, and a concentration of the third metal material in the metal layer is less than a concentration of the second metal material in the metal layer.

15. The method of claim 11, further comprising forming a contact plug over the metal silicide layer.

16. The method of claim 15, further comprising forming a capping layer over the metal silicide layer prior to the formation of the contact plug.

17. A semiconductor structure, comprising:
    an epitaxial structure comprising a semiconductor material;
    a metal silicide layer on the epitaxial structure, wherein the metal silicide layer comprises the semiconductor material, a first metal material and a second metal material, an atomic size of the first metal material is greater than an atomic size of the second metal material and a concentration of the first metal material in the metal silicide layer varies along a thickness direction;
    a conductive plug on the metal silicide layer; and
    a capping layer between the conductive plug and the metal silicide layer.

18. The semiconductor structure of claim 17, wherein the metal silicide layer further comprises a third metal material, and an atomic size of the third metal material is greater than the atomic size of the second metal material.

19. The semiconductor structure of claim 18, wherein a concentration of the third metal material is less than the concentration of the first metal material.

20. The semiconductor structure of claim 17, wherein the concentration of the first metal material in the metal silicide layer varies along the thickness direction in a continuous manner.

* * * * *